United States Patent
Jee et al.

(10) Patent No.: US 8,742,577 B2
(45) Date of Patent: Jun. 3, 2014

(54) SEMICONDUCTOR PACKAGE HAVING AN ANTI-CONTACT LAYER

(75) Inventors: Young-kun Jee, Suwon-si (KR);
Sun-kyoung Seo, Suwon-si (KR);
Sang-wook Park, Hwaseong-si (KR);
Ji-hwan Hwang, Asan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/550,949

(22) Filed: Jul. 17, 2012

(65) Prior Publication Data
US 2013/0087917 A1    Apr. 11, 2013

(30) Foreign Application Priority Data
Oct. 10, 2011    (KR) .................. 10-2011-0103047

(51) Int. Cl.
*H01L 23/498*    (2006.01)
*H01L 23/48*    (2006.01)

(52) U.S. Cl.
USPC .............. 257/738; 257/E23.069; 257/E23.01; 257/E23.068; 257/E23.06; 257/E29.112; 257/686; 257/777; 257/778; 257/773; 257/774

(58) Field of Classification Search
USPC ................ 257/686, 685, 777, 778, 737, 738, 257/E23.06, E23.068, 773, 774, E29.112, 257/E23.069, E23.01
See application file for complete search history.

(56) References Cited

U.S. PATENT DOCUMENTS

| | | | |
|---|---|---|---|
| 5,965,934 A * | 10/1999 | Cheung et al. ................ | 257/642 |
| 7,851,346 B2 * | 12/2010 | Lee et al. ...................... | 438/613 |
| 8,242,611 B2 * | 8/2012 | Lee et al. ...................... | 257/781 |
| 2009/0001544 A1 * | 1/2009 | Jung ............................. | 257/686 |
| 2010/0308443 A1 * | 12/2010 | Suthiwongsunthorn et al. ............................ | 257/621 |
| 2011/0034021 A1 * | 2/2011 | Feng et al. .................... | 438/600 |
| 2011/0101526 A1 | 5/2011 | Hsiao et al. | |
| 2011/0298097 A1 * | 12/2011 | Sueyoshi et al. ............. | 257/621 |
| 2012/0199981 A1 * | 8/2012 | Jeong et al. ................... | 257/774 |
| 2012/0256310 A1 * | 10/2012 | Ide ................................ | 257/737 |
| 2012/0273959 A1 * | 11/2012 | Park et al. ..................... | 257/774 |
| 2012/0276733 A1 * | 11/2012 | Saeki et al. ................... | 438/613 |
| 2013/0093100 A1 * | 4/2013 | Shariff et al. ................. | 257/774 |
| 2013/0154107 A1 * | 6/2013 | Kim et al. ..................... | 257/774 |
| 2013/0299998 A1 * | 11/2013 | Na et al. ....................... | 257/774 |

FOREIGN PATENT DOCUMENTS

| | | |
|---|---|---|
| JP | 9-312295 A | 12/1997 |
| JP | 3829325 B2 | 7/2006 |
| KR | 10-2009-0039269 A | 4/2009 |

* cited by examiner

*Primary Examiner* — Alexander Oscar Williams
(74) *Attorney, Agent, or Firm* — Stanzione & Kim, LLP (57) ABSTRACT

A semiconductor package includes a first semiconductor chip, a second semiconductor chip disposed on the first semiconductor chip, and a connection member to electrically connect the first semiconductor chip and the second semiconductor chip. The connection member may include a connection pad disposed on the first semiconductor chip, a connection pillar disposed on the second semiconductor chip, and a bonding member to connect the connection pad and the connection pillar. An anti-contact layer may be formed on at least one surface of the connection pad.

19 Claims, 8 Drawing Sheets

SEMICONDUCTOR PACKAGE HAVING AN ANTI-CONTACT LAYER

CROSS-REFERENCE TO RELATED APPLICATIONS

This application claims priority under 35 U.S.C. §119(a) from Korean Patent Application No. 10-2011-0103047, filed on Oct. 10, 2011, in the Korean Intellectual Property Office, the disclosure of which is incorporated herein in its entirety by reference.

BACKGROUND

1. Field

The general inventive concept relates to semiconductor packages, and more particularly, to a semiconductor package including connection members to connect semiconductor chips.

2. Description of the Related Art

As electronic products are tending to become thinner, smaller and lighter, semiconductor devices and semiconductor packages are also becoming thinner, smaller and lighter. A process of miniaturizing a semiconductor device is accompanied by limitations to increase the performance of a semiconductor chip, e.g., a signal delay, caused by an increase in interconnection lines. To solve this problem, a technique of stacking a plurality of semiconductor chips by using a through silicon via (TSV) technique has been widely used. In this case, the plurality of semiconductor chips are connected via connection members each containing a conductive material.

SUMMARY

The present general inventive concept provides a semiconductor package with improved reliability and durability.

Additional features and utilities of the present general inventive concept will be set forth in part in the description which follows and, in part, will be obvious from the description, or may be learned by practice of the general inventive concept.

According to a feature of the present general inventive concept, there is provided a semiconductor package including a first semiconductor chip; a second semiconductor chip disposed on the first semiconductor chip; a connection member to electrically connect the first semiconductor chip and the second semiconductor chip, the connection member including a connection pad disposed on the first semiconductor chip, a connection pillar disposed on the second semiconductor chip, and a bonding member to connect the connection pad and the connection pillar; and an anti-contact layer formed on at least one surface of the connection pad.

The first semiconductor chip may include a through-silicon via (TSV) being electrically connected to the connection pad.

The bonding member may have low wettability on the anti-contact layer than on the connection pad.

In the connection pad, one surface adjacent to the bonding member may be wider than another surface adjacent to the first semiconductor chip.

The anti-contact layer may be formed to cover side surfaces of the connection pad and an upper surface of the connection pad adjacent to the bonding member.

The anti-contact layer may be formed to cover side surfaces of the connection pad and to extend on an upper surface of the first semiconductor chip.

The anti-contact layer may partially extend from edge regions of the connection pad to an upper surface of the connection pad adjacent to the bonding member.

The anti-contact layer may include an insulating layer.

The anti-contact layer may be disposed between the connection pad and the first semiconductor chip.

The anti-contact layer may include an intermetallic compound formed by reacting with the connection pad.

The connection pad may include copper (Cu), the bonding member may include an intermetallic compound containing tin (Sn), and the anti-contact layer may include aluminum (Al) or nickel (Ni).

The bonding member may include a solder ball, and does not extend to an upper surface of the first semiconductor chip.

According to another feature of the present general inventive concept, there is provided a semiconductor package including a semiconductor chip; a connection pad disposed on the semiconductor chip; a solder ball bonded with the connection pad; and an anti-contact layer formed on at least one surface of the connection pad.

Reactivity of the anti-contact layer to the solder ball may be lower than reactivity of the connection pad to the solder ball.

The solder ball may not extend along the anti-contact layer and thus may not contact the semiconductor chip.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings of which.

DETAILED DESCRIPTION OF THE EXEMPLARY EMBODIMENTS

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

Embodiments of the present general inventive concept are described herein with reference to cross-section illustrations that are schematic illustrations of exemplary embodiments (and intermediate structures) of the present general inventive concept. As such, variations from the shapes of the illustrations as a result, for example, of manufacturing techniques and/or tolerances, are to be expected. Thus, embodiments of the present general inventive concept should not be construed as limited to the particular shapes of regions illustrated herein but are to include deviations in shapes that result, for example, from manufacturing. The same reference numerals represent the same elements throughout the drawings. In the drawings, the lengths and sizes of layers and regions may vary for clarity.

As used herein, the term "and/or" includes any and all combinations of one or more of the associated listed items. Expressions such as "at least one of," when preceding a list of elements, modify the entire list of elements and do not modify the individual elements of the list.

Figure 1:
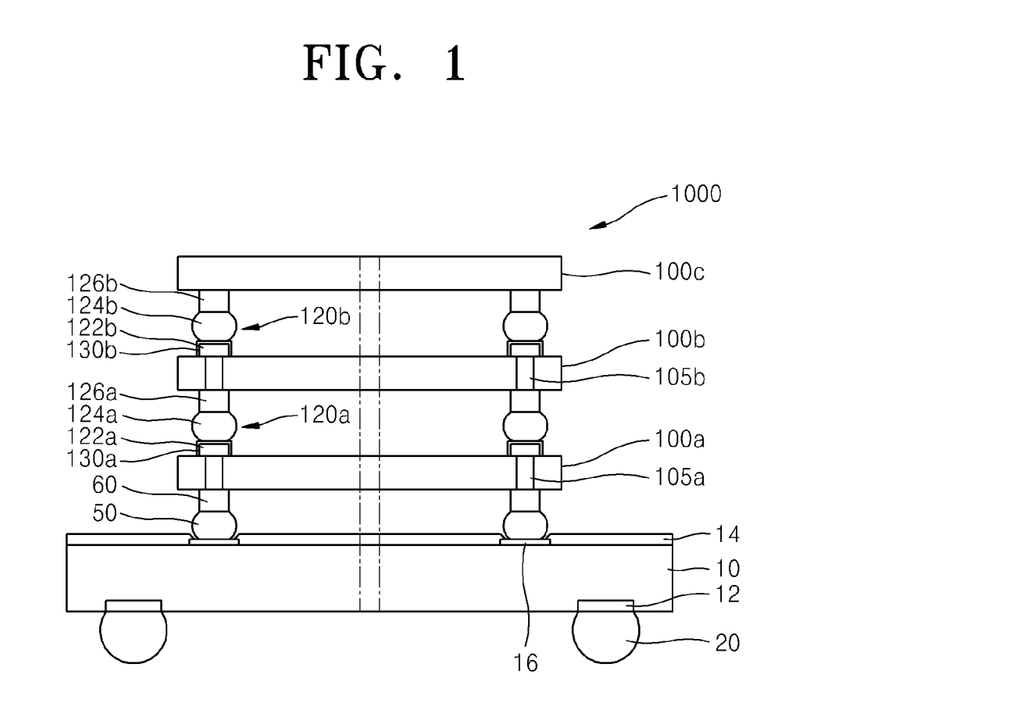
FIG. 1 is a cross-sectional view of a semiconductor package according to an embodiment of the present general inventive concept.

FIG. 1 is a cross-sectional view of a semiconductor package 1000 according to an embodiment of the present general inventive concept. Referring to FIG. 1, the semiconductor package 1000 includes a substrate 10, and a plurality of semiconductor chips. For example, the semiconductor package 1000 may include a first semiconductor chip 100a, a second semiconductor chip 100b, and a third semiconductor chip 100c. The semiconductor package 1000 may further include first connection members 120a to connect the first semiconductor chip 100a and the second semiconductor chip 100b, second connection members 120b to connect the second semiconductor chip 100b and the third semiconductor chip 100c, and a plurality of solders 50 and a plurality of supporting pillars 60 to connect the first semiconductor chip 100a to the substrate 10. In at least one exemplary embodiment of the present general inventive concept, the semiconductor chip package may include a stacked semiconductor chip package having a plurality of semiconductor chips stacked with respect to one another.

The substrate 10 may be formed of various materials including, but not limited to, glass, ceramic, and plastic material. The substrate 10 may be a substrate included in a semiconductor package, e.g., a printed circuit board, a ceramic substrate, or a tape circuit board. Lower pads 12 may be disposed on a bottom surface of the substrate 10, and upper pads 16 may be disposed on a top surface of the substrate 10. Each of the lower pads 12 and the upper pads 16 may contain a conductive material. The lower pads 12 and the upper pads 16 may be formed of a material selected from the group including of aluminum (Al), copper (Cu), gold (Au), silver (Ag), tin (Sn), chrome (Cr), palladium (Pd), and a mixture thereof. A solder resist layer 14 may further be formed on the substrate 10. The substrate 10 may further include interconnection lines therein to electrically connect the lower pads 12 and the upper pads 16. The sizes of and the numbers of the lower pads 12 and the upper pads 16 described herein are exemplary and the present general inventive concept is not limited thereto.

Referring to at least one exemplary embodiment illustrated in FIG. 1, the first semiconductor chip 100a, the second semiconductor chip 100b, and the third semiconductor chip 100c are sequentially disposed on the substrate 10 in the order stated. For example, the first semiconductor chip 100a, the second semiconductor chip 100b, and the third semiconductor chip 100c may be sequentially stacked one on top of the other, and supported by the substrate 10. The first, second, and third semiconductor chips 100a, 100b, and 100c may include, but are not limited to, a logic semiconductor chip and a memory semiconductor chip. The logic semiconductor chips may be microprocessors, e.g., a central processing unit (CPU), a controller, and/or an application-specific integrated circuit (ASIC). Also, the memory semiconductor chips may be volatile memory, e.g., dynamic random access memory (DRAM) and static random access memory (SRAM), and/or non-volatile memory, such as flash memory. Each of the first, second, and third semiconductor chips 100a, 100b, and 100c may include a plurality of semiconductor chips. The plurality of semiconductor chips may be the same type or different types of semiconductor chips. For example, each of the first, second, and third semiconductor chips 100a, 100b, and 100c may include a combination of at least one logic semiconductor chip and at least one memory semiconductor chip.

The first semiconductor chip 100a and the second semiconductor chip 100b may be connected via the first connection members 120a, and the second semiconductor chip 100b and the third semiconductor chip 100c may be connected via the second connection members 120b. The first connection members 120a and the second connection members 120b may provide an electrical connection path between the first, second, and third semiconductor chips 100a, 100b, and 100c. The first, second, and third semiconductor chips 100a, 100b, and 100c and the first and second connection members 120a and 120b may be sealed with a molding member and may thus be protected from external impact.

Each of the first connection members 120a may include a connection pad 122a, a bonding member 124a, and a connection pillar 126a. Each of the second connection members 120b may include a connection pad 122b, a bonding member 124b, and a connection pillar 126b. The connection pads 122a and 122b, the connection pillars 126a and 126b, and the bonding members 124a and 124b may each contain a conductive material, e.g., a material selected from the group including copper (Cu), nickel (Ni), and a mixture thereof.

An anti-contact layer 130a may be disposed on at least one surface of each of the connection pads 122a, and an anti-contact layer 130b may be disposed on at least one surface of each of the connection pads 122b. The anti-contact layers 130a and 130b may prevent the bonding members 124a and 124b from extending along side surfaces of the connection pads 122a and 122b to the first semiconductor chip 100a and the second semiconductor chip 100b, respectively. The connection members 120a and 120b and the anti-contact layers 130a and 130b will be described in detail with reference to FIGS. 2 to 9 below.

The first semiconductor chip 100a may include through-silicon vias (TSVs) 105a that contact the connection members 120a, and the second semiconductor chip 100b may include TSVs 105b that contact the connection members 120b. The TSVs 105a and 105b may provide an electrical connection path between the first connection members 120a and the second connection members 120b and between the first connection members 120a and the supporting pillars 60.

The TSVs 105a and 105b may have a multi-layered structure, e.g., a structure in which an insulating layer, an anti-diffusion layer, and a conductive layer are sequentially stacked. The TSVs 105a and 105b may include at least one selected from the group including aluminum (Al), gold (Au), beryllium (Be), bitmuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The TSVs 105a and 105b may be formed by chemical vapor deposition (CVD), plasma-enhanced CVD (PECVD), high-density plasma-CVD (HDP-CVD), sputtering, metal organic CVD (MOCVD), or atomic layer deposition (ALD).

The first semiconductor chip 100a may be electrically connected to the substrate 10 via the solders 50 and the supporting pillars 60. The solders 50 and the supporting pillars 60 may contain a conductive material. The solders 50 and the supporting pillars 60 may be formed of metal selected from the group including of aluminum (Al), copper (Cu), gold (Au), silver (Ag), tin (Sn), chrome (Cr), palladium (Pd), and a mixture thereof. Although under bump metal (UBM) may be disposed between the supporting pillar 60 and the first semiconductor chip 100a. According to a modified example of the present general inventive concept, the first semiconductor chip 100a may be electrically connected to the substrate 10 via a connection member, such as the first and second connection members 120a and 120b.

The lower pads 12 on the bottom surface of the substrate 10 may be electrically and/or physically connected to external connection members 20. The substrate 10 may be electrically connected to the outside via the external connection members 20. Thus, the semiconductor package 1000 may be electrically connected to the outside via the external connection members 20. The external connection members 20 may be, for example, solder balls. Otherwise, the external connection members 20 may have a flip chip structure including a grid array, such as a pin grid array, a ball grid array, or a land grid array.

FIGS. 2 to 9 are cross-sectional views of semiconductor packages 200 to 900 according to other embodiments of the present general inventive concept. In FIGS. 2 to 9, the same reference numerals as in FIG. 1 denote same elements and will thus not be repeatedly described here.

Figure 2:
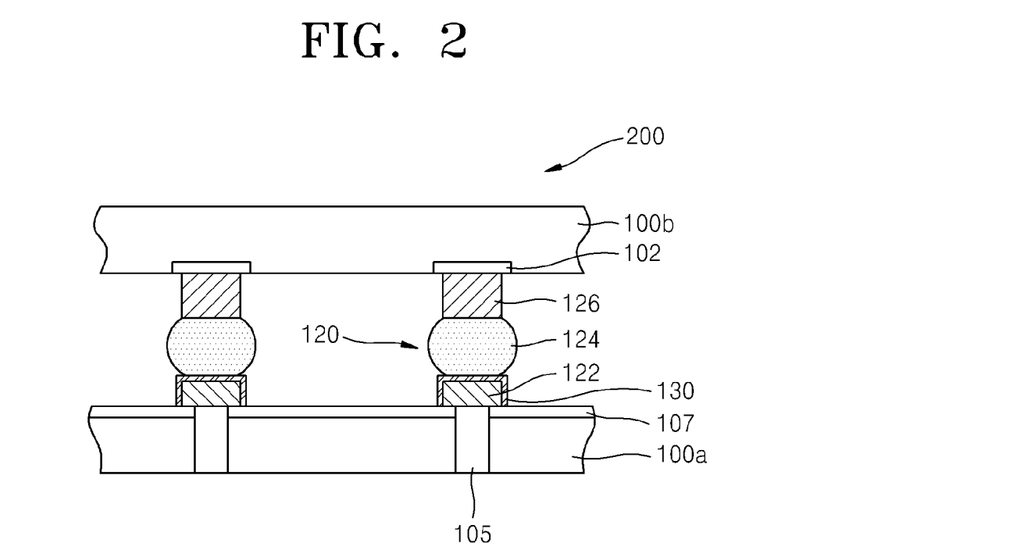
FIGS. 2 to 9 are cross-sectional views of semiconductor packages according to other embodiments of the present general inventive concept.

Referring to FIG. 2, the semiconductor package 200 includes a first semiconductor chip 100a, a second semiconductor chip 100b, connection members 120, and anti-contact layers 130. Each of the connection members 120 may include a connection pad 122, a bonding member 124, and a connection pillar 126.

The first semiconductor chip 100a may further include TSVs 105 that completely pass through the first semiconductor chip 100a. The first semiconductor chip 100a may further include insulating layers 107 on an upper surface thereof. The TSVs 105 may be electrically connected to the connection pads 122 on the first semiconductor chip 100a. The insulating layers 107 may be passivation layers that protect the first semiconductor chip 100a and insulate the first semiconductor chip 100a from the outside. The insulating layers 107 may include, for example, a silicon nitride and/or a silicon oxide.

The second semiconductor chip 100b may be disposed on the first semiconductor chip 100a. The second semiconductor chip 100b may include conductive layers 102 on a bottom surface thereof. The conductive layers 102 may be electrically connected to the connection pillars 126, respectively.

The connection members 120 may electrically connect the first semiconductor chip 100a and the second semiconductor chip 100b. In at least one exemplary embodiment illustrated in FIG. 2, the connection member 120 may include a uniform connection member having a uniform shape including, but not limited to, a rectangular shape.

The connection pad 122 and the connection pillar 126 may contain, for example, copper (Cu), nickel (Ni), or a mixture thereof. The bonding member 124 may be bonded onto the connection pillar 126, and then be bonded with the connection pad 122. In at least one exemplary embodiment, the connection pad 122 includes an upper surface that contact the bonding member 124, and a lower surface that contacts the insulating layer 107 and/or the TSV 105. The connection pad 122 and the connection pillar 126 may have a cylindrical or polygonal pillar shape. The connection pillar 126 may be at a higher height than the connection pad 122 but the present general inventive concept is not limited thereto.

The bonding member 124 between the connection pad 122 and the connection pillar 126 connects the connection pad 122 and the connection pillar 126. In at least one exemplary embodiment, a width of the bonding member 124 exceeds a width of the connection pad 122. The bonding member 124 may include an intermetallic compound including tin (Sn). The bonding member 124 may be disposed on the anti-contact layer 130. According to another embodiment of the present general inventive concept, the bonding member 124 may extend on a side surface of the anti-contact layer 130 toward the first semiconductor chip 100a by a predetermined length.

The anti-contact layer 130 may be disposed between the connection pad 122 and the bonding member 124 and may have a shape covering upper and side surfaces of the connection pad 122. The anti-contact layer 130 may include an intermetallic compound including tin (Sn). When the bonding member 124 and the connection pad 122 are bonded with each other, the anti-contact layer 130 may prevent the bonding member 124, which may be at least partially fused, from extending along side surfaces of the connection pad 122 to the insulating layer 107. In other words, the bonding member 124 may be prevented from extending along the side surfaces of the anti-contact layer 130, and thereby preventing the bonding member 124 from contacting the insulating layer 107. This may be accomplished by appropriately selecting materials of the bonding member 124 and the anti-contact layer 130 in such a manner that the bonding member 124 may have sufficiently low wettability with respect to the anti-contact layer 130.

For example, the above operation of the anti-contact layer 130 may be possible when the connection pad 122 is formed of copper (Cu), the bonding member 124 is formed of tin (Sn), the anti-contact layer 130 is formed of an intermetallic compound including tin (Sn), and the bonding member 124 thus has lower wettability and reactivity on an intermetallic compound including tin (Sn) than on copper (Cu). It is appreciated that the materials selected above are exemplary, and the present general inventive concept is not limited thereto.

In the semiconductor package 200, the anti-contact layer 130 is formed to cover the upper and side surfaces of the connection pad 122, thereby preventing the bonding member 124 from extending along the side surfaces of the connection pad 122 to the insulating layer 107. Thus, a tensile force applied to the first semiconductor chip 100a may be reduced, and the reliability and durability of the semiconductor package 200 may be improved.

Figure 3:
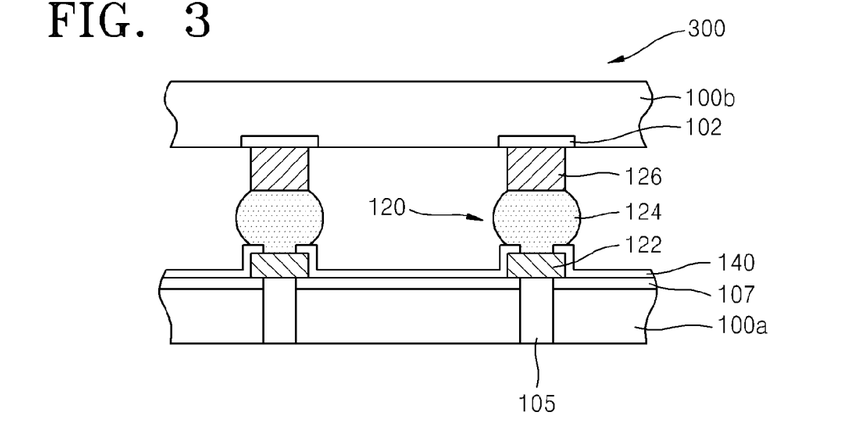

Referring to FIG. 3, the semiconductor package 300 includes a first semiconductor chip 100a, a second semiconductor chip 100b, connection members 120, and an anti-contact layer 140. Each of the connection members 120 may include a connection pad 122, a bonding member 124, and a connection pillar 126.

The anti-contact layer 140 may be formed on an insulating layer 107 to cover side surfaces and upper edges of the connection pads 122. The anti-contact layer 140 may contain, for example, an insulating material, e.g., a silicon nitride. When the bonding member 124 and the connection pad 122 are bonded with each other, the anti-contact layer 140 may prevent the bonding member 124, which may be at least partially fused, from extending along side surfaces of the connection pad 122 to the insulating layer 107. This is possible since the bonding member 124 that includes a metallic material has low wettability with respect to the anti-contact layer 140 that includes an insulating material.

Figure 4:
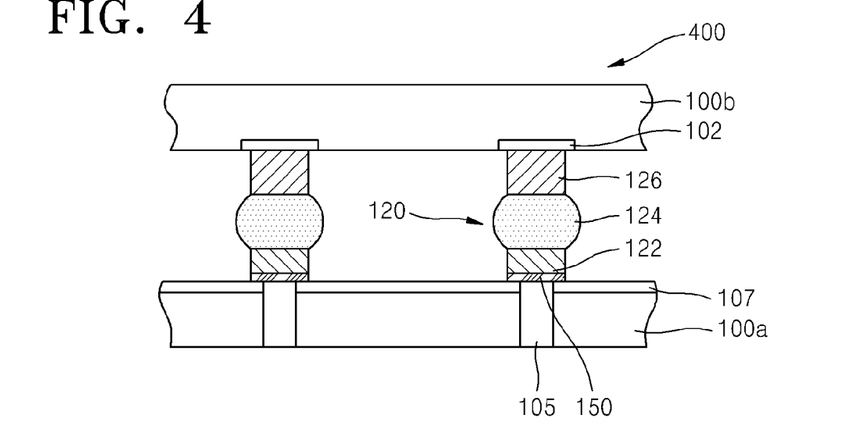

Referring to FIG. 4, the semiconductor package 400 includes a first semiconductor chip 100a, a second semiconductor chip 100b, connection members 120, and anti-contact layers 150. Each of the connection members 120 may include a connection pad 122, a bonding member 124, and a connection pillar 126.

The anti-contact layers 150 may be disposed between an upper surface of the first semiconductor chip 100a and bottom surfaces of the connection pads 122. The anti-contact layers 150 may be formed of a material that causes the bonding members 124 to have lower wettability on the anti-contact layer 150 than on the connection pads 122. The anti-contact layers 150 may include, for example, a conductive material containing aluminum (Al) and/or nickel (Ni). When the bonding member 124 and the connection pad 122 are bonded with each other, the anti-contact layer 150 may prevent the bonding member 124, which may be at least partially fused, from extending along side surfaces of the connection pad 122 to an insulating layer 107. In other words, although the bonding member 124 extends along the side surfaces of the connection pad 122, the bonding member 124 may not extend to the insulating layer 170 due to the anti-contact layer 150.

Figure 5:
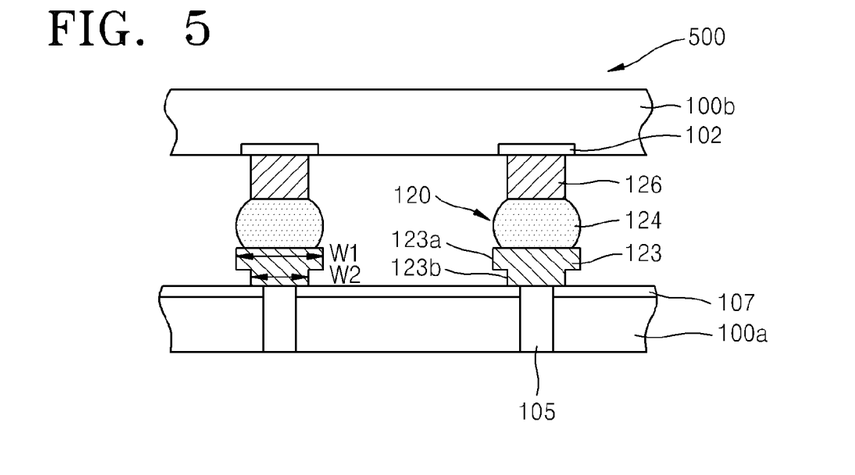

Referring to FIG. 5, the semiconductor package 500 includes a first semiconductor chip 100a, a second semiconductor chip 100b, and connection members 120. Each of the connection members 120 may include a connection pad 123, a bonding member 124, and a connection pillar 126. The connection pad 123 may include, but is not limited to, a non-uniform connection pad. In at least one exemplary embodiment illustrated in FIG. 5, the connection pad 123 has a T-shape, as described in greater detail below.

The connection pad 123 may be formed of, for example, metal selected from the group of copper (Cu), nickel (Ni), and a mixture thereof. As described earlier, the connection pad 123 may include a non-uniform T-shaped connection pad having an upper portion 123a and a lower portion 123b. The upper portion 123a has an upper width W1 and the lower portion 123b has a lower width W2. The upper width W1 may be wider than the lower width W2. The upper portion 123a has an upper surface that contacts the bonding member 124, and the lower portion 123b has a lower surface that contacts the first semiconductor chip 100a. In at least one exemplary embodiment, the lower surface of the lower portion 123b may contact the insulating layer 107 and/or the TSV 105.

In at least one exemplary embodiment, the connection pad 123 may include a bent portion between the upper surface having the upper width W1 and the lower surface having the lower width W2, but is not limited thereto. At least one exemplary embodiment of the present general inventive concept may also include a connection pad 123 having a tapered portion that tapers between two or more points of the connection pad. For example, the tapered portion may taper from the top of the connection pad 123 to the bottom of the connection pad 123.

When the bonding member 124 and the connection pad 123 are bonded with each other, the connection pad 123 prevents the bonding member 124, which may be at least partially fused, from extending to an insulating layer 107. In at least one exemplary embodiment, the upper width W1 of the connection pad 123 may exceed a width of the bonding member 123. Accordingly, since the upper width W1 of the connection pad 123 is wider than the lower width W2 thereof, the bonding member 124 may be prevented from extending to side surfaces of the connection pad 123. Even if the bonding member 124 extends along the side surfaces of the connection pad 123, the bonding member 124 may be prevented from extending to the lower surface of the connection pad 123 that has the lower width W2. This is because the fused bonding member 124 may have low wettability on the bent portion, since a contact angle that the fused bonding member 124 forms with the connection pad 123 at the side surfaces of the connection pad 123 is different than in the bent portion.

In the semiconductor package 500, the connection pad 123 having at least two widths may prevent the bonding member 124 from extending to the insulating layer 107. Thus, a tensile stress applied to the first semiconductor chip 100a may be reduced and the reliability and durability of the semiconductor package 500 may be improved.

Figure 6:
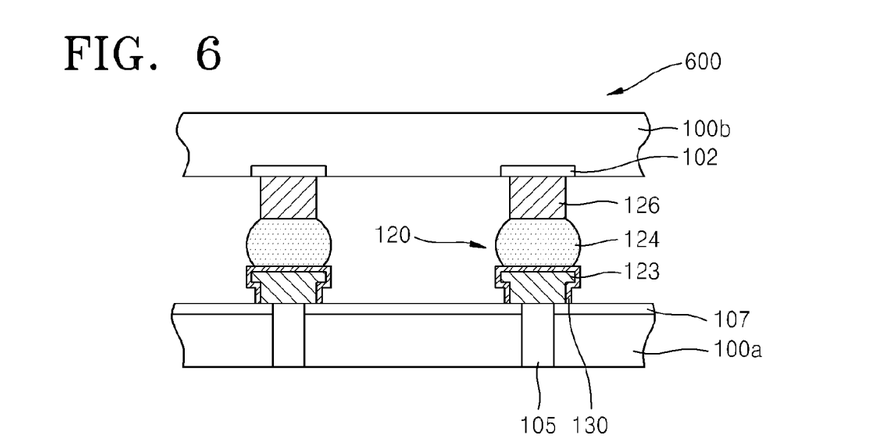

Referring to FIG. 6, the semiconductor package 600 includes a first semiconductor chip 100a, a second semiconductor chip 100b, connection members 120, and anti-contact layers 130. Each of the connection members 120 may include a connection pad 123, a bonding member 124, and a connection pillar 126.

In the connection pads 123, an upper surface of the upper portion 123a contacting the bonding member 124 may be wider than a lower surface of the lower portion 123b contacting the first semiconductor chip 100a, as shown in at least one exemplary embodiment illustrated in FIG. 5.

In at least one exemplary embodiment, the anti-contact layer 130 may be disposed between the connection pad 123 and the bonding member 124 and may have a shape covering upper and side surfaces of the connection pad 123. The anti-contact layer 130 may include an intermetallic compound including, but not limited to, tin (Sn). When the bonding member 124 and the connection pad 123 are bonded with each other, the anti-contact layer 130 prevents the bonding member 124, which may be at least be partially fused, from extending along the side surfaces of the connection pad 123 to an insulating layer 107. In other words, the bonding member 124 does not extend along the side surfaces of the anti-contact layer 130 to the insulating layer 107. This may be accomplished by appropriately selecting materials of the bonding member 124 and the anti-contact layer 130 in such a manner that the bonding member 124 may have sufficiently low wettability with respect to the anti-contact layer 130.

For example, the above operation of the anti-contact layer 130 may be possible when the connection pad 123 is formed of copper (Cu), the bonding member 124 is formed of tin (Sn), the anti-contact layer 130 is formed of an intermetallic compound including tin (Sn), and the bonding member 124 thus has lower wettability on an intermetallic compound including tin (Sn) than on copper (Cu). It can be appreciated that the materials selected above are exemplary, and the present general inventive concept is not limited thereto.

In the semiconductor package 600, the connection pad 123 having at least two widths and the anti-contact layer 130 are formed to prevent the bonding member 124 from extending to the insulating layer 107. In at least one exemplary embodiment, the two widths of the connection pad 123 may be different from one another. Compared to the semiconductor package 500 of FIG. 5, the connection member 120 further includes the anti-contact layers 130. Thus, it is possible to effectively prevent the contact member 124 from extending to the insulating layer 107 by using not only the physically bent shape of the connection pad 123 but also the wettability and reactivity of the bonding member 124 with respect to the anti-contact layer 130.

Figure 7:
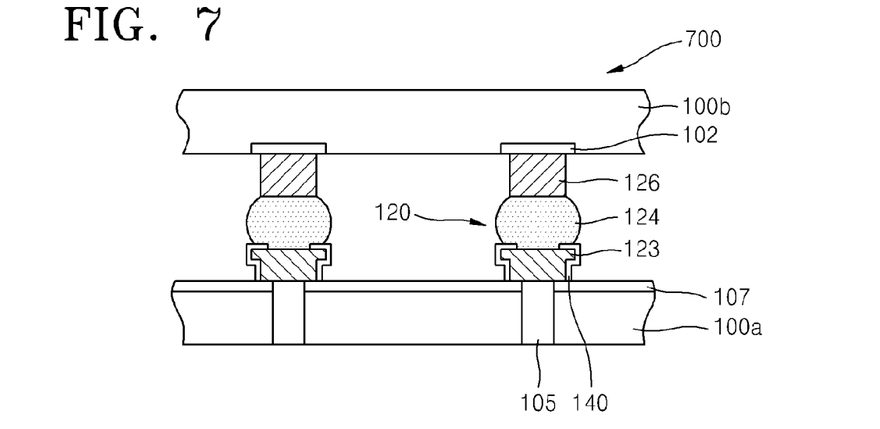

Referring to FIG. 7, the semiconductor package 700 includes a first semiconductor chip 100a, a second semiconductor chip 100b, connection members 120, and anti-contact layers 140. Each of the connection members 120 may include a connection pad 123, a bonding member 124, and a connection pillar 126.

An upper portion 123a including an upper surface of the connection pad 123, which contacts the bonding member 124, may have an upper width that is wider than a lower width of a lower portion 123b, which includes a lower surface of the connection pad 123 that contacts the first semiconductor chip 100a.

In at least one exemplary embodiment illustrated in FIG. 7, the anti-contact layers 140 may be partially disposed on the connection pad 123. For example, each of the anti-contact layers 140 may be disposed on an insulating layer 107 to cover side and upper surfaces of the connection pad 123. Each of the anti-contact layers 140 may contain an insulating material, e.g., a silicon nitride and/or a silicon oxide. Accordingly, when the bonding member 124 and the connection pad 123 are bonded with each other, the anti-contact layer 140 prevents the bonding member 124, which may be at least partially fused, from extending along the side surfaces of the connection pad 123 to the insulating layer 107. This is possible since the bonding member 124, which includes a metallic material, has low wettability with respect to the anti-contact layer 140 that includes the insulating material.

Compared to the semiconductor package 500 of FIG. 5, the semiconductor package 700 further includes the anti-contact layers 140. Thus, it is possible to effectively prevent the contact member 124 from extending to the insulating layer 107 by using not only the physically bent shape of the connection pad 123 but also the wettability and reactivity of the bonding member 124 with respect to the anti-contact layer 140.

Figure 8:
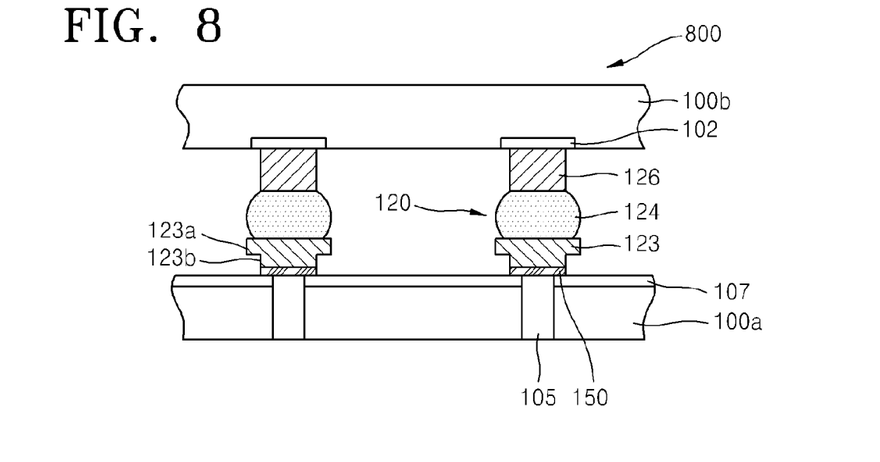

Referring to FIG. 8, the semiconductor package 800 includes a first semiconductor chip 100a, a second semiconductor chip 100b, connection members 120, and anti-contact layers 150. Each of the connection members 120 may include a connection pad 123, a bonding member 124, and a connection pillar 126.

In at least one exemplary embodiment, the connection pad 123 may include an upper portion 123a and a lower portion 123b. The upper portion 123 may have an upper width W1, and may include an upper surface contacting the bonding member 124. The lower portion 123b may have a lower width W2, and may include a lower surface that contacts the first semiconductor chip. The upper width W1 of the upper portion 123a may be wider than the lower width W2 of the lower portion contacting the first semiconductor chip 100a, similar to the exemplary embodiment illustrated in FIG. 5.

The anti-contact layer 150 may be disposed on the first semiconductor chip 100a and below the corresponding connection pad 123. For example, the anti-contact layer 150 may directly contact the insulation layer and/or the TSV 105 and a lower surface of the lower portion 123b of the connection pad 123. The anti-contact layer 150 may be formed of a material that causes the bonding member 124 to have lower wettability on the anti-contact layer 150 than on the connection pad 123. The anti-contact layer 150 may include, for example, a conductive material including, but not limited to, aluminum (Al) and nickel (Ni). When the bonding member 124 and the connection pad 123 are bonded with each other, the anti-contact layer 150 may prevent the bonding member 124, which may be partially fused, from extending along side surfaces of the connection pad 123 to an insulating layer 107. In other words, although the bonding member 124 extends along the side surfaces of the connection pad 123, the bonding member 124 may further be prevented from extending along the anti-contact layer 150.

Figure 9:
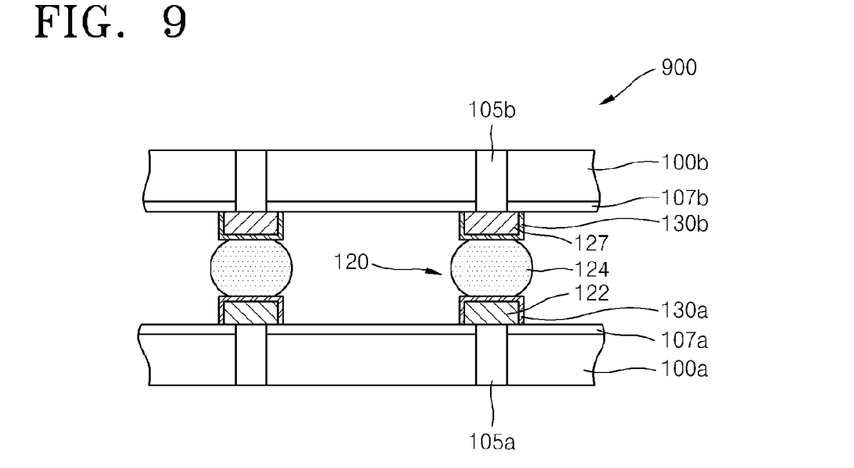

Referring to FIG. 9, the semiconductor package 900 includes a first semiconductor chip 100a, a second semiconductor chip 100b, and connection members 120. Each of the connection members 120 may include a connection pad 122, a bonding member 124, and a connection pillar 127. The connection pad 122 and the connection pillar 127 may each include anti-contact layers 130a and 130b, respectively. The upper elements and lower elements of the semiconductor package 900 may be symmetrical about the bonding members 124.

The first semiconductor chip 100a may include TSVs 105a that pass therethrough, and the second semiconductor chip 100b may include TSVs 105b that pass therethrough. Also, the first semiconductor chip 100a and the second semiconductor chip 100b may further respectively include insulating layers 107a and 107b thereon. The TSVs 105a and 105b may be respectively electrically connected to the connection pad 122 and the connection pillar 127. The insulating layers 107a and 107b may protect the first and second semiconductor chips 100a and 100b and may insulate the first and second semiconductor chips 100a and 100b from the outside. The insulating layers 107a and 107b may include, for example, a silicon nitride and/or a silicon oxide.

The connection member 120 may electrically connect the first semiconductor chip 100a and the second semiconductor chip 100b.

The connection pad 122 and the connection pillar 127 may include, for example, a material selected from the group including copper (Cu), nickel (Ni), and a mixture thereof. The connection pad 122 and the connection pillar 127 may include various shapes including, but not limited to, a cylindrical shape and a polygonal pillar shape.

The bonding member 124 may connect the connection pad 122 and the connection pillar 127 and may be, for example, an intermetallic compound including tin (Sn). The bonding member 124 may be disposed on the anti-contact layers 130a and 130b. In at least one exemplary embodiment of the present general inventive concept, the bonding member 124 may extend by a predetermined length along side surfaces of the anti-contact layers 130a and 130b. For example, the bonding member 124 may extend by a predetermined length along the side surfaces of the anti-contact layer 130a.

The anti-contact layers 130a and 130b may be respectively disposed between the connection pad 122 and the bonding member 124 and between the connection pillar 127 and the bonding member 124. The anti-contact layer 130a may have a shape covering upper and side surfaces of the connection pad 122, and the anti-contact layer 130b may have a shape covering upper and side surfaces of the connection pillar 127. The anti-contact layers 130a and 130b may be intermetallic compounds containing tin (Sn). When the bonding member 124, the connection pad 122, and the connection pillar 127 are bonded with one another, the anti-contact layers 130a and 130b may prevent the bonding member 124, which may be partially fused, from extending along side surfaces of the connection pad 122 and the connection pillar 127 to insulating layers 107a and 107b. In other words, the bonding member 124 does not extend along side surfaces of the anti-contact layers 130a and 130b to the insulating layers 107a and 107b.

Figure 10:
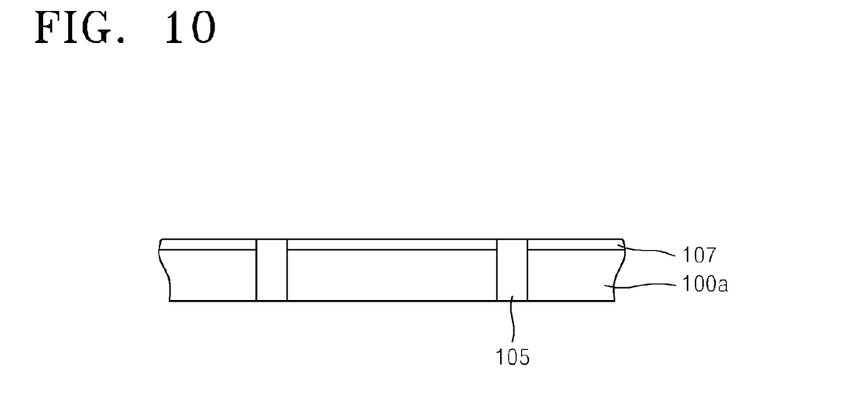
FIGS. 10 to 14 are cross-sectional views illustrating a method of fabricating the semiconductor package of FIG. 2, according to an embodiment of the present general inventive concept.

FIGS. 10 to 14 are cross-sectional views illustrating a method of fabricating the semiconductor package 200 of FIG. 2, according to at least one exemplary embodiment of the present general inventive concept. Referring to FIG. 10, the TSVs 105 may be formed in the first semiconductor chip 100a and the insulating layer 107 may be formed on the first semiconductor chip 100a. The TSVs 105 may be formed by forming holes through the first semiconductor chip 100a, sequentially forming an insulating layer and an anti-diffusion layer on the first semiconductor chip 100a, and then filling the holes with a conductive material.

Then, upper surfaces of the first semiconductor chip 100a are partially etched in such a manner that the TSVs 105 may partially protrude from the upper surfaces of the first semiconductor chip 100a. Then, an insulating material is deposited on the resultant first semiconductor chip 100a, thereby forming the insulating layer 107. In this case, chemical mechanical planarization (CMP) may be performed to control an upper surface of the insulating layer 107 to be at the same height as upper surfaces of the TSV 105.

Figure 11:
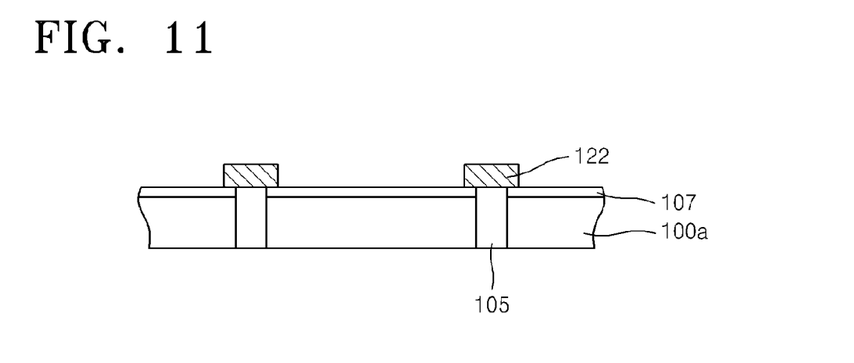

Referring to FIG. 11, the connection pads 122 may be formed to cover the exposed upper surfaces of the TSVs 105 and to extend to the insulating layer 107. The connection pads 122 may include metal selected from the group including copper (Cu), nickel (Ni), and a mixture thereof.

For example, electrolytic plating may be used to form the connection pads 122. In this case, a seed layer may first be formed to perform electroplating. The seed layer may be, for example, a multiple layer formed of titanium (Ti) and copper (Cu). Then, the seed layer may be patterned using photolithographical and etching processes to leave portions corresponding to regions the connection pads 122 to be formed.

Figure 12:
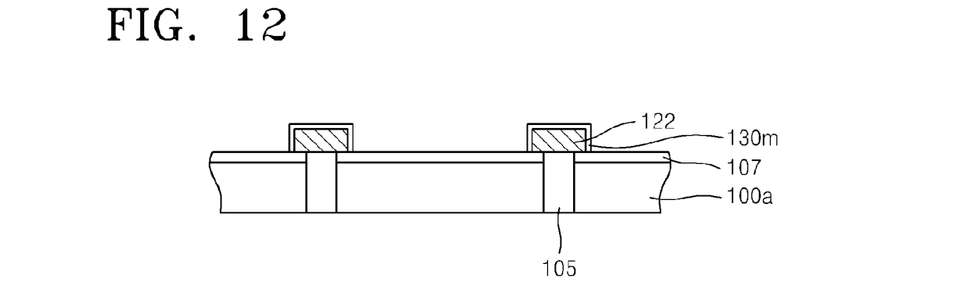

Referring to FIG. 12, an anti-contact layer material 130m may be applied onto the connection pads 122. The anti-contact layer material 130m may include a material that causes the bonding members 124 (see FIG. 2), which will be formed during a subsequent process, to have lower wettability with respect to the anti-contact layer material 130m than the connection pads 122. The anti-contact layer material 130m may include, for example, tin (Sn).

The anti-contact layer material 130m may be applied to cover exposed upper and side surfaces of the connection pads 122. The anti-contact layer material 130m may be obtained, for example, by electrolytic plating. In this case, the connection pads 122 may be used as a seed layer.

Figure 13:
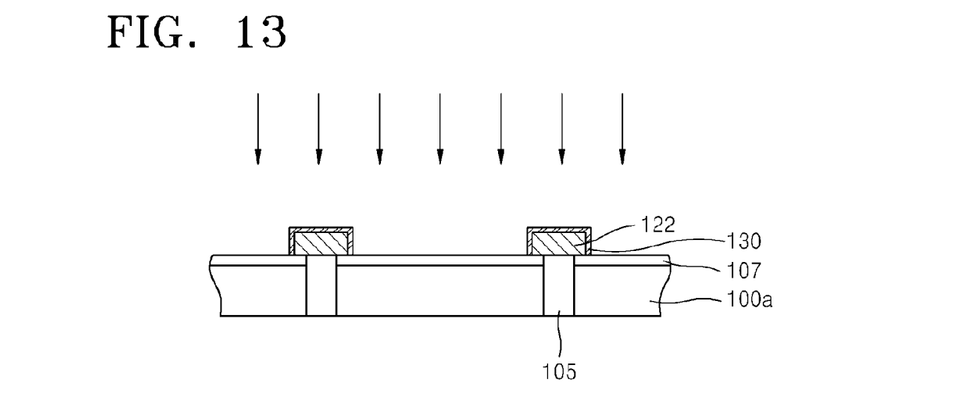

Referring to FIG. 13, a heat treatment may be performed to allow the anti-contact layer material 130m to react with the connection pads 122, thereby forming an intermetallic compound. The heat treatment may be performed at a temperature that is equal to or higher than a melting point of the anti-contact layer material 130m.

For example, if the connection pads 122 are formed of copper (Cu) and the anti-contact layer material 130m is formed of tin (Sn), then a copper-tin compound, e.g., $Cu_6Sn_5$, may be formed according to the heat treatment.

Figure 14:
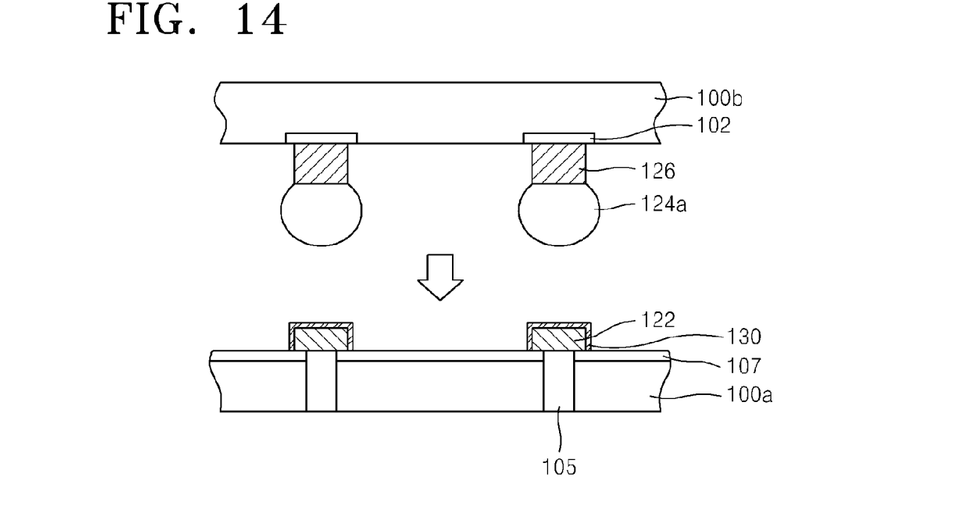

Referring to FIG. 14, the second semiconductor chip 100b may be prepared, in which connection pillars 126 and preliminary bonding members 124a are formed on one surface thereof. On the second semiconductor chip 100b, the conductive layers 102 may be formed to be electrically connected to the connection pillars 126. The connection pillars 126 may include, for example, metal selected from the group including copper (Cu), nickel (Ni), and a mixture thereof. The preliminary bonding members 124a may include, for example, tin (Sn).

Then, a reflow process may be performed to connect the connection pads 122 on the first semiconductor chip 100a and the preliminary bonding members 124a on the second semiconductor chip 100b with the anti-contact layers 130 disposed therebetween. The reflow process may be performed at a temperature that is equal to or greater than a melting point of the preliminary bonding members 124a. Then, the preliminary bonding members 124a may be at least partially fused to bond with the anti-contact layers 130. The preliminary bonding members 124a react with the connection pillars 126 and/or the anti-contact layers 130 to form the bonding members 124 (see FIG. 2) that include the intermetallic compound.

When the preliminary bonding members 124a are bonded with the anti-contact layers 130, the preliminary bonding members 124a have low wettability with respect to the anti-contact layers 130 and may thus be prevented from extending to the insulating layer 107 although they extend along side surfaces of the anti-contact layers 130. For example, if the connection pads 122 are formed of copper (Cu), the anti-contact layers 130 are formed of a copper-tin compound, and the preliminary bonding members 124a are formed of tin (Sn), then the preliminary bonding members 124a may have lower wettability with respect to the anti-contact layers 130 than with respect to the connection pads 122.

Thus, the semiconductor package 200 of FIG. 2 may be completely fabricated. Thereafter, although a molding process may be performed to seal the first and second semiconductor chips 100a and 100b.

Figure 15:
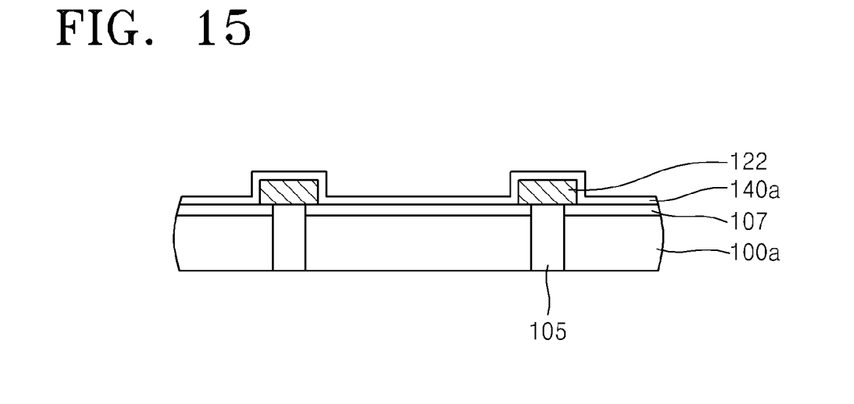
FIGS. 15 to 17 are cross-sectional views illustrating a method of fabricating the semiconductor package of FIG. 3, according to another embodiment of the present general inventive concept.
Figure 16:
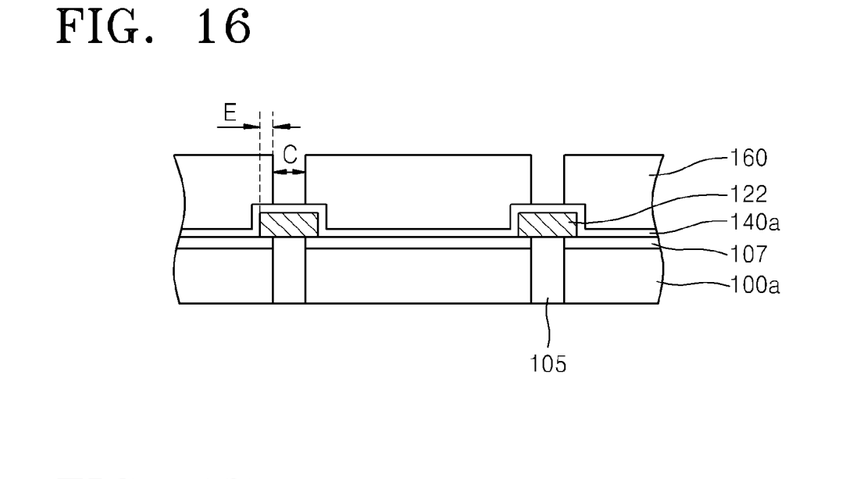
Figure 17:
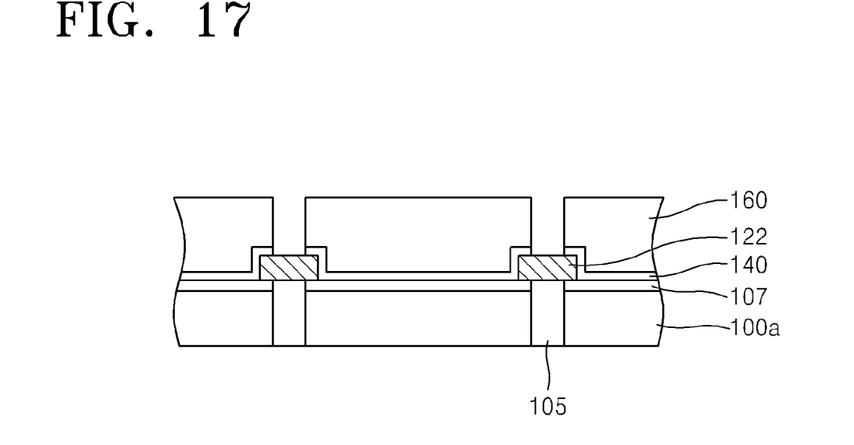

FIGS. 15 to 17 are cross-sectional views illustrating a method of fabricating the semiconductor package 300 of FIG. 3, according to another embodiment of the present general inventive concept. Referring to FIG. 15, first, the first semiconductor chip 100a is prepared and the connection pads 122 are formed as described above with reference to FIGS. 10 and 11. Then, an anti-contact layer material 140a may be applied to cover upper and side surfaces of the connection pads 122 and an upper surface of the insulating layer 107.

The anti-contact layer material 140a may include an insulating material, such as a silicon nitride or a silicon oxide. The anti-contact layer material 140a may be formed by CVD or physical vapor deposition (PVD).

Referring to FIG. 16, a mask pattern 160 may be formed to expose the anti-contact layer material 140a on centers of the connection pads 122. If the connection pads 122 have a cylindrical pillar shape, the anti-contact layer material 140a may be exposed as a circle. Portions of the anti-contact layer material 140a, which are applied at edges E of the connection pads 122, are not exposed due to the mask pattern 160. According to another embodiment of the present general inventive concept, the mask pattern 160 may be formed to expose the anti-contact layer material 140a on the edges E. In this case, portions of the anti-contact layer material 140a, which are formed on the side surfaces of the connection pad 122, may also not be exposed.

The mask pattern 160 may be a photoresist pattern and may be formed according to a photolithography process.

Referring to FIG. 17, the exposed portions of the anti-contact layer material 140a are removed. The removing may be performed by dry and/or wet etching. After the removing is performed, the anti-contact layers 140 are formed to partially cover the connection pads 122. For example, the anti-contact layers may be formed to cover the side surfaces of the connection pads 122 and to partially extend to the upper surfaces of the connection pads 122, thereby partially exposing an upper surface of the connection pads 122.

Then, the mask pattern 160 may be removed, and the reflow process may be performed as described above with reference to FIG. 14. If the reflow process is performed, the second semiconductor chip 100b and the first semiconductor chip 100a may be electrically connected, thus obtaining the semiconductor package 300 of FIG. 3.

Referring back to FIG. 3, the bonding member 124 may be bonded onto the connection pad 122 and may be prevented from extending along side surfaces of the anti-contact layer 140 to the insulating layer 170. For example, if the anti-contact layer 140 is formed of silicon nitride and the preliminary bonding member 124a (see FIG. 14) is formed of tin (Sn), then the preliminary bonding member 124a may have very low wettability and reactivity with respect to the anti-contact layer 140.

Figure 18:
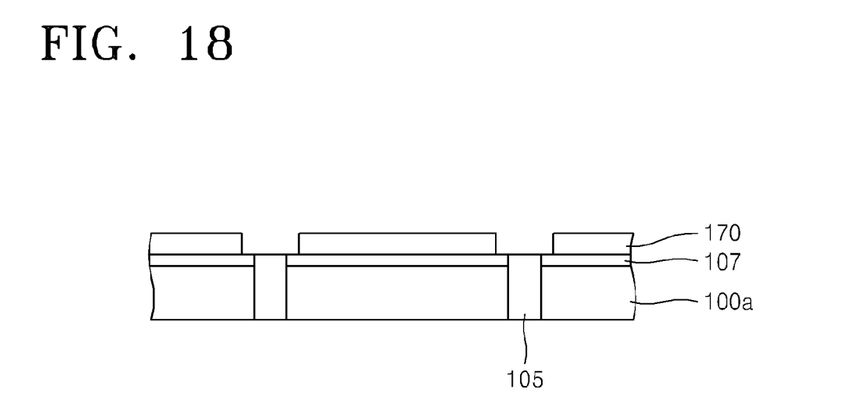
FIGS. 18 to 20 are cross-sectional views illustrating a method of fabricating the semiconductor package of FIG. 8, according to another embodiment of the present general inventive concept.
Figure 19:
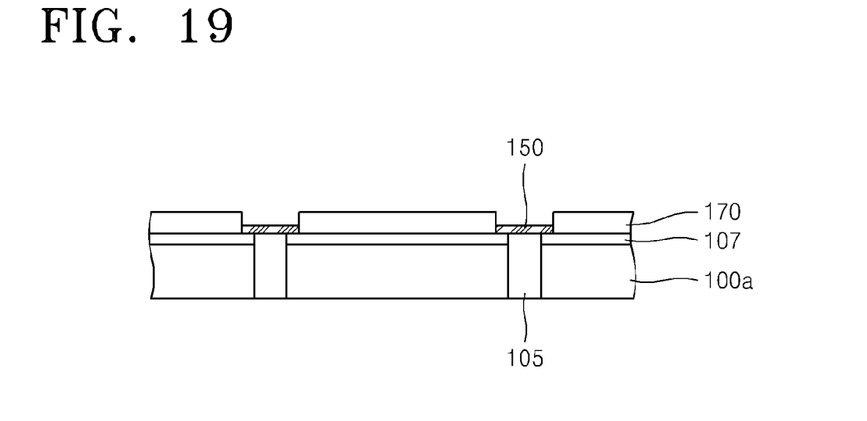
Figure 20:
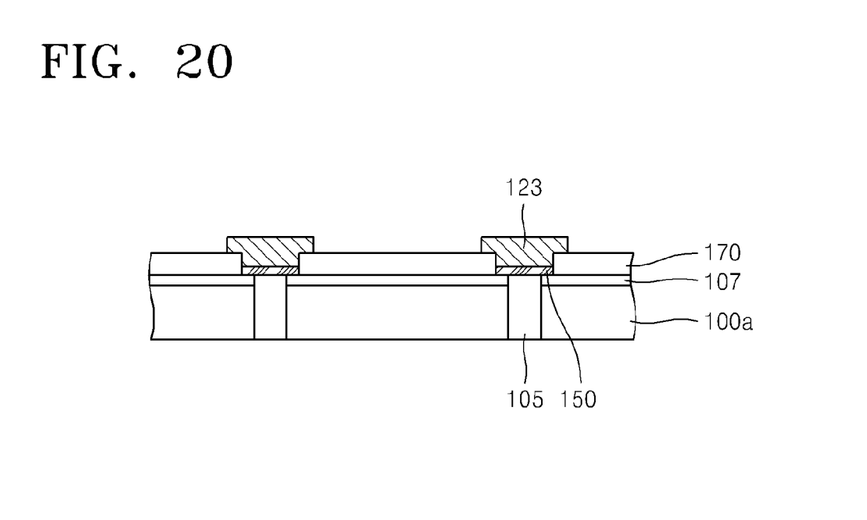

FIGS. 18 to 20 are cross-sectional views illustrating a method of fabricating the semiconductor package 800 of FIG. 8, according to another embodiment of the present general inventive concept. Referring to FIG. 18, first, the first semiconductor chip 100a may be prepared as described above with reference to FIG. 10. Then, a mask pattern 170 may be formed to expose upper surfaces of the TSVs 105 and portions of the insulating layer 107 that contact the TSVs 105.

The mask pattern 170 may be a photoresist pattern and may be formed according to a photolithography process.

Referring to FIG. 19, the anti-contact layers 150 may be formed on the exposed upper surfaces of the TSVs 105 and the exposed portions of the insulating layer 107. The anti-contact layers 150 may include a material having low reactivity with respect to the bonding members 124 (see FIG. 8) which will be formed during a subsequent process. If the bonding members 124 include tin (Sn), the anti-contact layers 150 may include, for example, a conductive material, such as aluminum (Al) and/or nickel (Ni). The anti-contact layer 150 may be formed by sputtering.

Referring to FIG. 20, the connection pads 123 may be formed on the anti-contact layer 150. The connection pads 123 may be formed to fill a recess in the mask pattern 170 in which the anti-contact layers 150 are exposed, and to extend onto the mask pattern 170. Thus, in the connection pads 123, upper surfaces may be wider than lower surfaces that contact the anti-contact layers 150.

For example, electrolytic plating may be used to form the connection pads 123. In this case, a seed layer may first be formed on the anti-contact layers 150 to perform electrolytic plating. The seed layer may be, for example, a multiple layer formed of titanium (Ti) and copper (Cu).

Then, the mask pattern 170 may be removed, and the reflow process may be performed as described above with reference to FIG. 14. If the reflow process is performed, the second semiconductor chip 100b and the first semiconductor chip 100a may be electrically connected, thus obtaining the semiconductor package 800 of FIG. 8.

Referring back to FIG. 8, the bonding member 124 may be bonded onto the connection pad 123 and may be prevented from extending along side surfaces of the anti-contact layer 150 to the insulating layer 170. In other words, since the upper surface of the connection pad 123 is wider than the lower surface thereof, the bonding member 124 is prevented from extending along side surfaces of the connection pad 123. Although the bonding member 124 extends along the side surfaces of the connection pad 123, it may not extend to side surfaces of the anti-contact layer 150. For example, this is possible when the anti-contact layer 150 is formed of aluminum (Al), the preliminary bonding member 124a (see FIG. 14) is formed of tin (Sn), and the preliminary bonding member 124a thus has very low reactivity to the anti-contact layer 150 and has very low wettability with respect to the anti-contact layer 150.

Figure 21A:
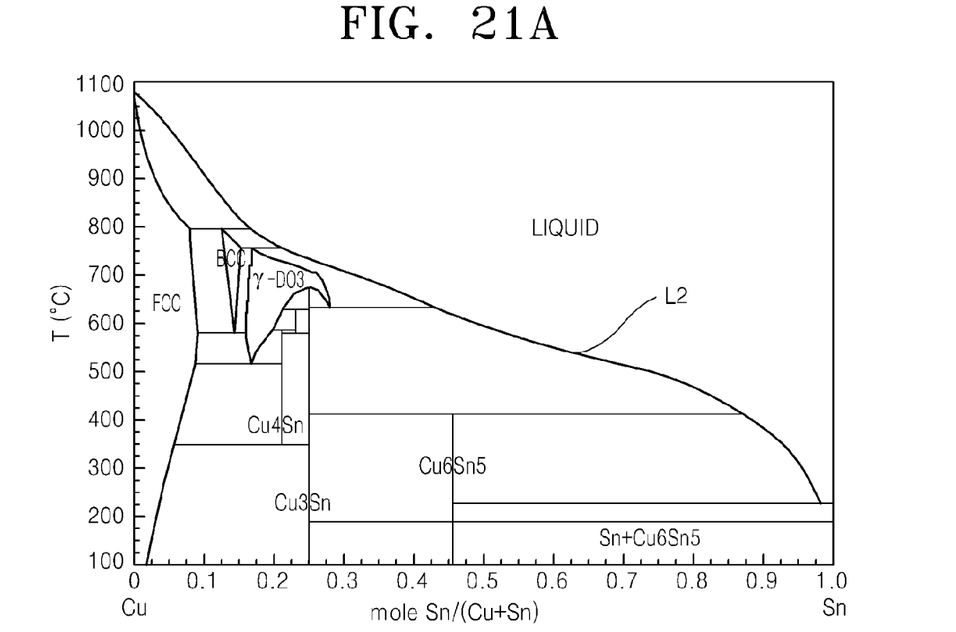
FIG. 21A is a graph showing states of a copper (Cu)-tin (Sn) binary system.
Figure 21B:
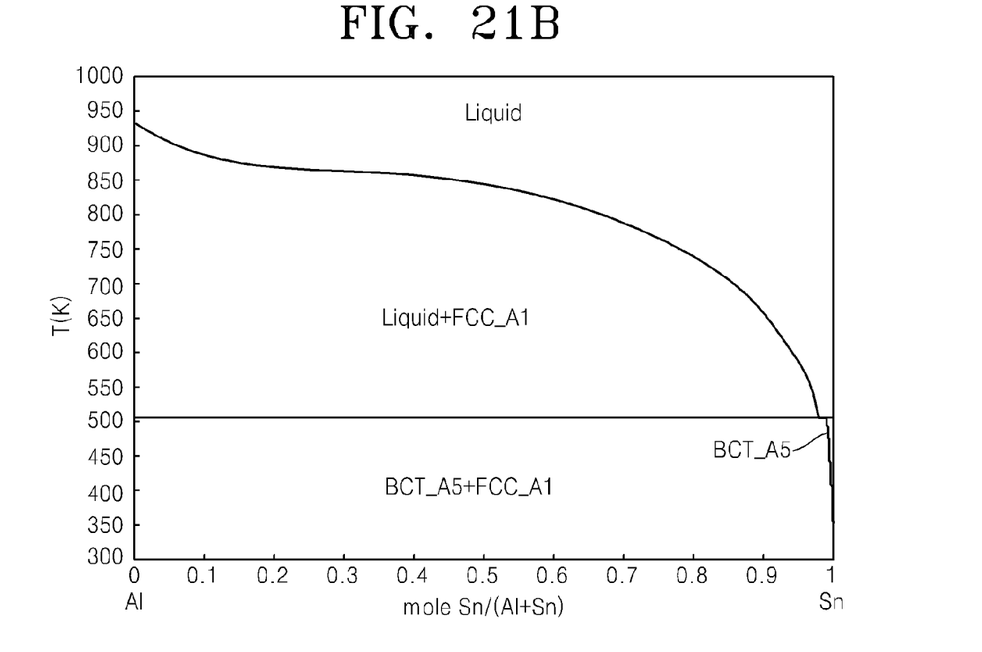
FIG. 21B is a graph showing states of an aluminum (Al)-tin (Sn) binary system.

FIG. 21A is a graph showing states of a copper (Cu)-tin (Sn) binary system. FIG. 21B is a graph showing states of an aluminum (Al)-tin (Sn) binary system.

Specifically, FIG. 21A is a phase diagram of states of a copper (Cu)-tin (Sn) binary system. Referring to FIG. 21A, copper (Cu) has a melting point of about 1085° C. (about 1358 K), and the higher a ratio of tin (Sn) to copper (Cu), the lower the melting point of copper (Cu). As illustrated in FIG. 21A, it is possible to obtain various compounds, e.g., $Cu_3Sn$ and $Cu_6Sn_5$, by controlling a relative ratio of copper (Cu) and tin (Sn).

FIG. 21B is a phase diagram of states of an aluminum (Al)-tin (Sn) binary system. Referring to FIG. 21B, it is impossible to obtain any intermediate compound by controlling a relative ratio of aluminum (Al) and tin (Sn).

For example, if in the embodiment of FIG. 4 or 8, the bonding member 124 is formed of tin (Sn), the anti-contact layer 150 formed of aluminum (Al) may not react with the bonding member 124. In this case, the bonding member 124 may be prevented from extending along the anti-contact layer 150.

As discussed in detail above, a semiconductor package includes a connection member having a connection pad with a first surface that contacts a bonding member, such as solder, and a second surface that contacts a semiconductor chip. Accordingly, at least one exemplary embodiment discussed above provides a connection pad that may prevent the bonding member from extending beyond the connection pad, and may prevent the bonding member from contacting the semiconductor chip.

Although a few exemplary embodiments of the present general inventive concept have been shown and described, it will be appreciated by those skilled in the art that changes may be made in these exemplary embodiments without departing from the principles and spirit of the present general inventive concept, the scope of which is defined in the appended claims and their equivalents.

What is claimed is:

1. A semiconductor package comprising:
a first semiconductor chip;
a second semiconductor chip disposed on the first semiconductor chip;
a connection member to electrically connect the first semiconductor chip and the second semiconductor chip, the connection member including a connection pad disposed on the first semiconductor chip, a connection pillar disposed on the second semiconductor chip, and a bonding member to connect the connection pad and the connection pillar; and
an anti-contact layer formed on at least one surface of the connection pad, the anti-contact layer to prevent the bonding member from extending along side surfaces of the connection pad to the first semiconductor chip and the second semiconductor chip, respectively.

2. The semiconductor package of claim 1, wherein the first semiconductor chip comprises a through-silicon via (TSV) being electrically connected to the connection pad.

3. The semiconductor package of claim 1, wherein the bonding member has low wettability on the anti-contact layer than on the connection pad.

4. The semiconductor package of claim 1, wherein, in the connection pad, one surface adjacent to the bonding member is wider than another surface adjacent to the first semiconductor chip.

5. The semiconductor package of claim 1, wherein the anti-contact layer is formed to cover side surfaces of the connection pad and an upper surface of the connection pad adjacent to the bonding member.

6. The semiconductor package of claim 1, wherein the anti-contact layer is formed to cover side surfaces of the connection pad and to extend on an upper surface of the first semiconductor chip.

7. The semiconductor package of claim 6, wherein the anti-contact layer partially extends from edge regions of the connection pad to an upper surface of the connection pad adjacent to the bonding member.

8. The semiconductor package of claim 6, wherein the anti-contact layer comprises an insulating layer.

9. The semiconductor package of claim 1, wherein the anti-contact layer is disposed between the connection pad and the first semiconductor chip.

10. The semiconductor package of claim 1, wherein the anti-contact layer comprises an intermetallic compound formed by reacting with the connection pad.

11. The semiconductor package of claim 1, wherein the connection pad comprises copper (Cu), the bonding member comprises an intermetallic compound containing tin (Sn), and the anti-contact layer comprises aluminum (Al) or nickel (Ni).

12. The semiconductor package of claim 1, wherein the bonding member comprises a solder ball, and does not extend to an upper surface of the first semiconductor chip.

13. A semiconductor package comprising:
a semiconductor chip;
a connection pad disposed on the semiconductor chip;
a solder ball bonded with the connection pad; and
an anti-contact layer formed on at least one surface of the connection pad, the anti-contact layer to prevent the solder ball from extending along side surfaces of the connection pad to the semiconductor chip.

14. The semiconductor package of claim 13, wherein reactivity of the anti-contact layer to the solder ball is lower than reactivity of the connection pad to the solder ball.

15. The semiconductor package of claim 13, wherein the solder ball does not extend along the anti-contact layer and thus does not contact the semiconductor chip.

16. A stacked semiconductor package including a first semiconductor chip and a second semiconductor chip to be connected via a bonding member, the stacked semiconductor package comprising:
a lower connection pad having a first width, and including a top surface and a bottom surface disposed on the first semiconductor chip;
an upper connection pad having a second width being greater than the first width of the lower connection pad, the upper connection pad having a lower surface disposed on the top surface of the lower connection pad and an upper surface to contact the bonding member and prevent the bonding member from contacting the first semiconductor chip; and
an anti-contact layer formed on at least one surface at least one of the lower connection pad and the upper connection pad, the anti-contact layer to prevent the bonding member from extending along side surfaces of the upper connection pad to the first semiconductor chip.

17. The stacked semiconductor package of claim 16, wherein the anti-contact layer decreases the wettability of the bonding member.

18. The stacked semiconductor package of claim 17, wherein the anti-contact layer completely surrounds the lower connection pad and partially surrounds the upper connection pad to define a void.

19. The stacked semiconductor package of claim 18, wherein the bonding member directly contacts a surface of the upper connection pad via the void.

* * * * *